(12) United States Patent
Matsunaga et al.

(10) Patent No.: US 6,633,137 B2
(45) Date of Patent: Oct. 14, 2003

(54) ELECTRICAL APPARATUS

(75) Inventors: Yoshiyuki Matsunaga, Kanagawa-ken (JP); Hajime Osaki, Kanagawa-ken (JP); Kenichi Asami, Kanagawa-ken (JP); Isao Abe, Kanagawa-ken (JP)

(73) Assignee: Toshiba Lighting & Technology Corporation, Tokyo (JP)

( * ) Notice: Subject to any disclaimer, the term of this patent is extended or adjusted under 35 U.S.C. 154(b) by 0 days.

(21) Appl. No.: 10/107,423

(22) Filed: Mar. 28, 2002

(65) Prior Publication Data
US 2002/0140368 A1 Oct. 3, 2002

(30) Foreign Application Priority Data

Mar. 30, 2001 (JP) ....................................... 2001-102504
Feb. 21, 2002 (JP) ....................................... 2002-044973

(51) Int. Cl.[7] ............................ H05B 37/00; H05K 1/18
(52) U.S. Cl. ...................................... 315/173; 361/761
(58) Field of Search ................................ 315/173, 174, 315/176, 186, 187, 188; 361/748, 750, 751, 752, 761, 762, 722, 773

(56) References Cited

U.S. PATENT DOCUMENTS

| 4,809,136 | A | * | 2/1989 | Choi ............................ 361/519 |
| 5,021,295 | A | * | 6/1991 | Nakane et al. ............... 428/379 |
| 5,119,466 | A | * | 6/1992 | Suzuki ........................ 388/831 |
| 5,733,823 | A | * | 3/1998 | Sugioka et al. ............. 442/110 |
| 6,426,874 | B2 | * | 7/2002 | Kajiura ........................ 361/700 |

FOREIGN PATENT DOCUMENTS

JP         8-329731          12/1996

* cited by examiner

*Primary Examiner*—Don Wong
*Assistant Examiner*—A D Minh
(74) *Attorney, Agent, or Firm*—Pillsbury Winthrop LLP

(57) ABSTRACT

An electrical apparatus comprises a circuit board, providing an electrolytic condenser and electrical components, and a housing. The housing accommodates the circuit board. The electrical components include resin containing one or more halogen compounds of about 1% by weight or less in terms of bromine (Br).

10 Claims, 5 Drawing Sheets

ELECTRICAL APPARATUS

BACKGROUND OF THE INVENTION

1. Field of the Invention

The present invention relates to an electrical apparatus, including an electrolytic condenser and electrical components using synthetic resin.

2. Description of the Related Art

Various electrical apparatuses are reduced in size and weight to be compact. Such electrical apparatuses, for example discharge lamp lighting apparatuses, are provided with a housing and a circuit board having electrical components mounted on a printed circuit substrate. Typically, a discharge lamp lighting apparatus, using an inverter circuit, is miniaturized, as the size of the inverter circuit is smaller than that of a ballast, using a core and coil as a current-limiting reactor.

Japanese Laid Open Patent Application HEI 8-329731 (prior art) discloses an electrical apparatus using electrical components. According to the prior art, a circuit board is accommodated by a housing to insulate the circuit board electrically. Temperature of the housing tends to increase and may be over 70 degrees centigrade. In this case, electrical components are distinguished between heat generating parts and less heat generating parts. Each of the distinguished components is mounted on a predetermined heat area or less heat area of the circuit board. A shelter is constructed and arranged between the predetermined heat area and the less heat area in order to block off heat, generated at the predetermined heat area, from the less heat area. Therefore, electrical components can be protected from the heat.

However, as the electrical apparatuses become more compact in size, the temperature therein tends to rise. Therefore, electrical components cannot sufficiently be protected from the heat, even if the shelter is used in the electrical apparatuses. Accordingly, it is desired to use heatproof electrical components. A synthetic resin, used in the heatproof electrical components, contains one or more flame retardant halogen compounds, resistant to burning or giving off smoke, when the temperature of the housing of the electrical apparatuses rises excessively.

However, when heatproof electrical components were used, it sometimes happened that an electrolytic condenser of the electrical components did not operate due to insufficient charge.

The electrolytic condenser is generally provided with a body filled with electrolytic solution, a pair of lead wires, and a packing rubber. According to the circumstances, the electrolytic condenser sometimes leaked out the electrolytic solution and failed. When inventors analyzed the electrolytic condenser, they found out that the leaking of the electrolytic solution was caused by corrosion of its electrodes or terminals made of aluminum. Furthermore, the inventors analyzed the leaked electrolytic solution, in order to find what caused the corrosion of the electrodes. As a result of the analysis, the leaked electrolytic solution was found to include bromine (Br) at a concentration of 3 PPM.

After the bromine penetrated the electrolytic solution through the packing rubber, it is considered that the bromine (Br) ionized and made the electrodes corrode as follows:

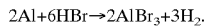

$2Al + 6HBr \rightarrow 2AlBr_3 + 3H_2$.

Then, it is presumed that the inner pressure of the electrolytic condenser increased, as the corrosion of electrodes gradually progressed. After the inner pressure excessively increased, a safety valve of the electrolytic condenser operated and the electrolytic solution leaked out.

When the inventors also analyzed the packing rubber of the electrolytic condenser, they detected bromine in the packing rubber. The concentration of the bromine inside the packing rubber was less than the concentration outside the packing rubber. Therefore, the inventors concluded that the bromine migrated through the packing rubber from outside the electrolytic condenser, and entered into the electrolytic solution.

Furthermore, the inventors investigated the causes of generation of the bromine, and found out that some of the electrical components emitted the bromine. For example, a film condenser, which included epoxy resins, included a halogen compound (flame retardant) such as hexabromobenzene ($C_6Br_6$) resistant to burning or giving off smoke. As the temperature of the electrical apparatus increased during a long operation, the temperature of the film condenser also rose. Accordingly, hexabromobenzene gradually sublimed or decomposed, so that the sublimed hexabromobenzene gas moved to the electrolytic condenser. It was estimated that the sublimed hexabromobenzene gas penetrated the electrolytic condenser through the packing rubber.

SUMMARY OF THE INVENTION

According to one aspect of the invention, an electrical apparatus comprises a circuit board providing an electrolytic condenser and electrical components, and a housing. The housing accommodates the circuit board. The electrical components include resin containing one or more halogen compounds of about 1% by weight or less in terms of bromine (Br).

According to another aspect of the invention, an electrical apparatus comprises a circuit board providing an electrolytic condenser and electrical components, and a housing accommodating the circuit board. The electrical components include resin containing one or more halogen compounds. The electrolytic condenser is covered with a cover element.

According to another aspect of the invention, an electrical apparatus comprises a circuit board, providing an electrolytic condenser and electrical components. The electrical components include resin containing one or more halogen compounds. The electrolytic condenser is covered with a cover element. A housing defines an air hole near the electrolytic condenser, and accommodates the circuit board.

According to another aspect of the invention, an electrical apparatus comprises a circuit board, providing electrical components including resin containing halogen compound. One end of an electrolytic condenser is arranged on the circuit board facing away from the electrical components. A housing accommodates the circuit board.

According to another aspect of the invention, an electrical apparatus comprises a circuit board, electrical components, an electrolytic condenser, a heat sink, and a housing. The housing accommodates the circuit board. The electrical components include resin containing one or more halogen compounds. A heat sink is constructed and arranged between the electrolytic condenser and the electrical components.

According to another aspect of the invention, an electrical apparatus comprises a circuit board, providing an electrolytic condenser and electrical components. The electrolytic condenser includes a body filled with ethylene glycol type-electrolytic solution, electrodes arranged in the body, lead wires extending from the body, and a packing rubber made of butyl rubber. The electrical components include resin containing one or more polymer type-halogen compounds. A housing accommodates the circuit board.

According to another aspect of the invention, an electrical apparatus comprises a circuit board, providing an electrolytic condenser and electrical components. The electrolytic condenser includes a body filled with ethylene glycol type-electrolytic solution, electrodes arranged in the body, lead wires extending from the body, and a packing rubber made of butyl rubber. The electrical components use resin, which contains one or more monomer type-halogen compounds. A housing accommodates the circuit board.

These and other aspects of the invention are further described in the following drawings and detailed description of the invention.

BRIEF DESCRIPTION OF THE DRAWINGS

The invention will be described below in more detail by way of examples illustrated by drawings in which.

DETAILED DESCRIPTION OF THE EMBODIMENTS

Figure 1:
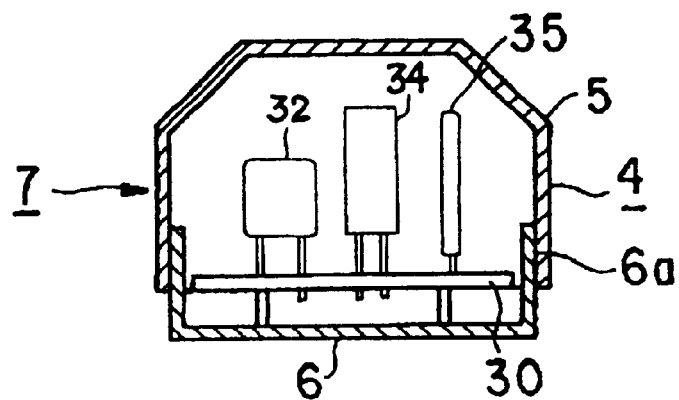
FIG. 1 is a cross section of an electrical apparatus according to a first embodiment of the present invention.

A first embodiment of the invention will be described in detail with reference to FIGS. 1 to 4. An electrical apparatus 7, shown in FIG. 1, is provided with a housing 4 accommodating a circuit board 30.

The housing 4, made of aluminum, for example, comprises a cover 5 and case 6. Each of the cover 5 and case 6 is formed to the rectangular shape having an opening side by bending an aluminum plate. The cover 5 is fixed on the case 6 with wrapping on each side portion of both the cover 5 and case 6. In this embodiment, the cover 5 does not define any air holes. Moreover, when the volume of the housing is 10000 cm$^3$ or less, the concentration of halogen compound gradually increases.

Figure 2:
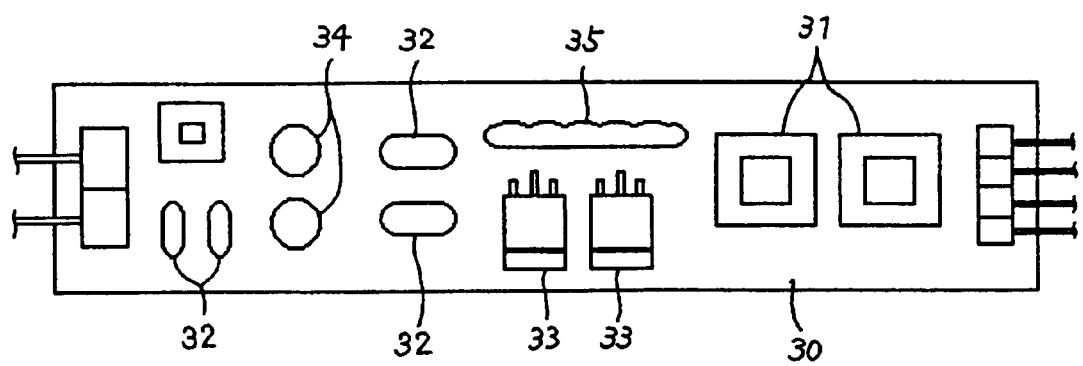
FIG. 2 is a top view of a circuit board of the electrical apparatus shown in FIG. 1.

The circuit board 30, shown in FIG. 2, comprises a printed circuit substrate and an inverter circuit including electrical components. The circuit board 30 may operate to light a discharge lamp, e.g., a fluorescent lamp. The discharge lamp operating circuit on the printed circuit substrate 30 is composed of a resonance transformer 31, a film condenser 32 for resonance, an inverter circuit including a switching element 33, e.g., transistor with heat sink, and an electrolytic condenser 34 for smoothing an alternating voltage, etc. Furthermore, a hybrid IC 35 on the circuit board 30 comprises a small sized substrate, which mounts different electrical components, e.g., a resistor, a condenser and transistor, covered with heatproof epoxy resin.

Figure 3:
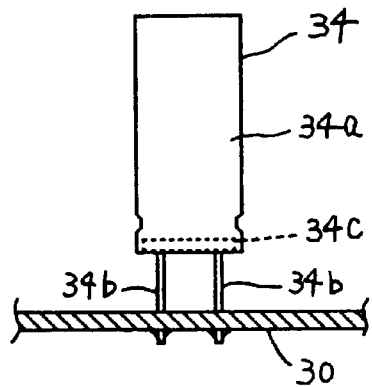
FIG. 3 is an enlarged side view of an electrolytic condenser mounted on the circuit board shown in FIG. 2.

FIG. 3 shows an enlarged side view of the electrolytic condenser 34, mounted on the circuit board 30. The electrolytic condenser 34 is provided with a body 34a filled with electrolytic solution made of ethylene glycol type, a pair of electrodes (not shown) arranged in the body 34a, a pair of lead wires 34b extending from the body 34a, and a packing rubber 34c made of butyl rubber.

Figure 4:
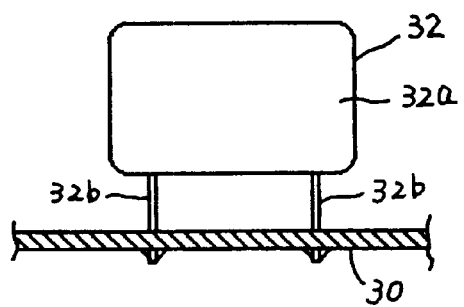
FIG. 4 is an enlarged side view of a film condenser mounted on the circuit board shown in FIG. 2.

FIG. 4 shows an enlarged side view of the film condenser 32, mounted on the circuit board 30. The film condenser 32 comprises a molded body 32a made of epoxy resin, accommodating a dielectric film, and a pair of lead wires 32b extending from the molded body 32a. The epoxy resin of the body 32a does not substantially contain halogen compounds of hexabromobenzene (flame retardant). Such epoxy resin is called halogen less type resin. In this embodiment, synthetic resin, utilized in other electronic components, is also a halogen less type resin.

That is, the film condenser 32, one of the electrical components, includes the resin containing one or more halogen compounds of about 1% by weight or less in terms of bromine (Br). When the inventors did a life experiment of an electrical apparatus, mainly including an electrolytic condenser and the above-mentioned electrical components, the electrical apparatus had a long life without leaking out electrolytic solution from the electrolytic condenser. No bromine substantially entered with respect to analyzing the electrolytic solution or the packing rubber of the electrolytic condenser. The electrical components may include the resin containing one or more halogen compounds of about 0.1% by weight or less in terms of bromine (Br). In this case, even if the temperature of the electrical apparatus is excessively high, the halogen compound is only slightly generated.

Furthermore, a measuring method of halogen compounds is generally described as follows: weighing the resin; burning synthetic resin including a halogen compound, for example, a bromine compound; changing the resin solid to a gas; dissolving the gas in water; using ion chromatography; measuring the amount of the halogen ion in moles; calculating the weight of the halogen by multiplying the amount of halogen ion by the atomic weight of bromine; and dividing the weight of bromine by the weight of the resin.

The synthetic resin used in the electrical components may be phenol resin, polybutyleneterephthalate (PBT), polyethyleneterephthalate (PET), or polycarbonate (PC). Furthermore, in examples including a housing, the synthetic resin may be PBT, PET, PC, acrylonitrile-butadiene-styrene copolymer (ABS), or polystyrene.

The halogen compound has two different molecular structures. One is a monomer type halogen compound including one or more selected from a group of hexabromobenzene, pentabromobenzene, tetrabromochlorobenzene, and tribromobisphenol. The other is a polymer type halogen compound including one or more selected from a group of bromine polycarbonate, bromine epoxy, and bromine styrene.

Still, the above mentioned monomer type halogen compound, e.g., hexabromobenzene, itself tends to be released outside without decomposing itself. Furthermore, it turns out that hexabromobenzene sometimes decomposes into a lower molecular-bromine compound. In this case, it is desired to use the resin under suitable conditions.

The above-mentioned polymer type halogen compound itself does not easily release outside the resin under ordinary conditions. However, the polymer type halogen compound gradually decomposes into a lower molecular-halogen compound, e.g., tribromophenol or dibromophenol under high temperatures or humid circumstances. After the halogen compound decomposes, tribromophenol or dibromophenol tends to sublimate and release outside. When the temperature of the circuit board is 70 degrees centigrade or more, the lower molecular-halogen compound is adequately generated outside the resin due to corrosion of the electrodes of the electrolytic condenser.

When the electrical apparatus 7 was operated, the electrical components themselves of the circuit board 30 generated heat. Therefore, the temperature in the housing 4 gradually became high, for example over 100 degrees centigrade. However, the electrolytic condenser 34 did not fail, even though the electrical apparatus was operated for a long time, because the electrolytic solution did not leak out from the electrolytic condenser 34.

In the case of a Comparative Example, that is, an example wherein an electrolytic condenser leaked out electrolytic solution and failed after an electrical apparatus, using a film condenser comprising a molded body made of epoxy resin including bromine (Br) of 2.0% by weight, was operated for 1000 hours. After the electrolytic condenser failed, the electrolytic solution of the condenser was analyzed. As a result, hexabromobenzene ($C_6Br_6$) was detected by chemical analysis, and the concentration of bromine (Br) in the electrolytic solution was about 10 PPM. It turned out that the electrolytic condenser 34 deteriorated, even if a very small quantity of hexabromobenzene diffused into the electrolytic solution. The above mentioned chemical analysis is a gas chromatography or a thermal decomposition-mass spectrometer. The chemical analysis utilizes a specific characteristic of hexabromobenzene, because the molecular structure of hexabromobenzene is hard to break down, even if a voltage is supplied to the hexabromobenzene.

Figure 5:
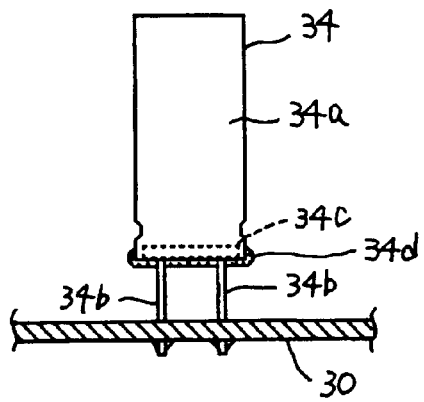
FIG. 5 is an enlarged side view of an electrolytic condenser mounted on a circuit board according to a second embodiment of the present invention.

FIG. 5 shows an enlarged side view of an electrolytic condenser mounted on a circuit board according to a second embodiment of the present invention. The same reference characters designate identical or corresponding elements to the elements of the electrolytic condenser 34 shown in FIG. 3. Also, other electrical components on a circuit board are the same to the components of the first embodiment. Therefore, a detailed explanation of such structure will not be provided.

The electrical components, which use halogen less type resin as in the first embodiment, generally increase costs. Moreover, efficiency of electrical components including halogen less type resin sometimes does not adapt to the electrical apparatus.

In this embodiment, an electrical apparatus 7 uses a different film condenser 32 than the first embodiment, comprising a molded body 32a made of epoxy resin including bromine (Br) of 2.0% by weight. An electrolytic condenser 34 further comprises a cover element 34d, made of urethane resin, covering a packing rubber 34c made of butyl rubber. The cover element 34d may be made of materials such as synthetic resin, e.g., silicone resin or poly vinyl chloride, metal, e.g., aluminum, glass, or ceramics, which can block off the migration of halogen compounds. Therefore, halogen compounds, e.g., hexabromobenzene ($C_6Br_6$) or lower molecular compounds, e.g., bromide compounds created from hexabromobenzene, can not easily get to the packing rubber 34c, and cannot penetrate the electrolytic condenser 34 via the packing rubber 34c.

Figure 6:
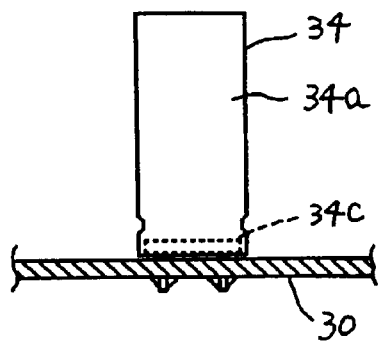
FIG. 6 is an enlarged side view of an electrolytic condenser mounted on a circuit board according to a third embodiment of the present invention.

FIG. 6 shows an enlarged side view of an electrolytic condenser 34, mounted on a circuit board according to a third embodiment of the present invention. The same reference characters designate identical or corresponding elements to the elements of the electrolytic condenser 34 shown in FIG. 3. Also, other electrical devices on a circuit board are the same as the components of the first embodiment. Therefore, a detailed explanation of such structures will not be provided.

In this embodiment, one end of an electrolytic condenser 34 providing a packing rubber 34c made of butyl rubber contacts the surface of a circuit board 30 leaving substantially no space between the packing rubber 34c and the circuit board 30. For example, the space may be 1.0 mm or less. Therefore, halogen compounds, e.g., hexabromobenzene ($C_6Br_6$) or lower molecular compounds, e.g., bromide compounds created from hexabromobenzene, can not easily get to the packing rubber 34c, and cannot break into the electrolytic condenser 34 via the packing rubber 34c. Accordingly, the electrolytic condenser 34 hardly fails, so that an electrical apparatus 7, using the film condenser of the second embodiment, is prevented from having a short life.

Figure 7:
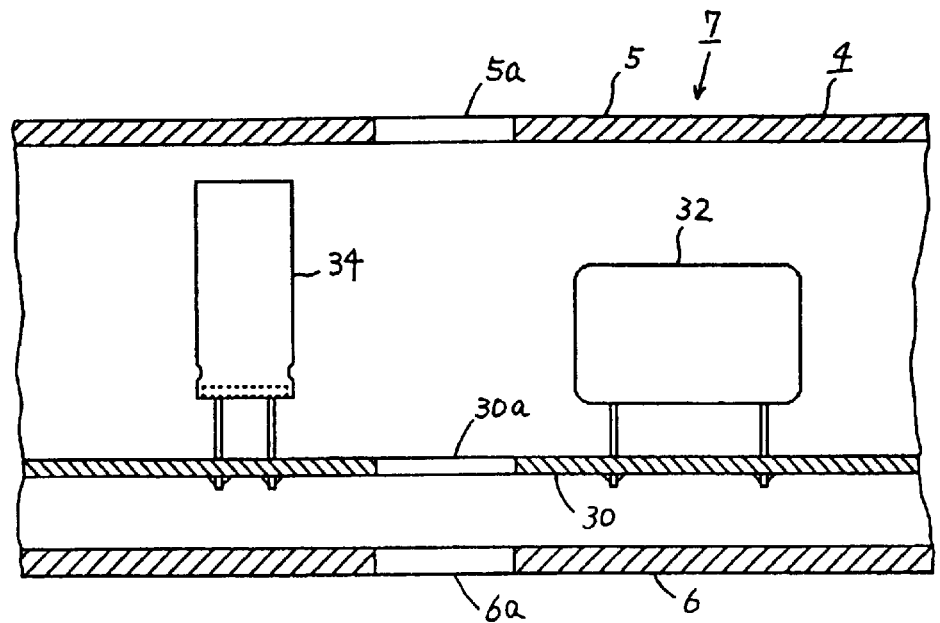
FIG. 7 is a partly enlarged longitudinal section of an electrical apparatus according to a fourth embodiment of the present invention.

FIG. 7 shows a partly enlarged longitudinal section of an electrical apparatus according to a fourth embodiment of the present invention. The same reference characters designate identical or corresponding elements to the elements of the electrical apparatus shown in FIG. 1. Therefore, a detailed explanation of such structures will not be provided.

In this embodiment, both a cover 5 and case 6 define air holes 5a, 6a, respectively, for passing heat generated by electrical components near an electrolytic condenser 34. The air holes 5a, 6a may be formed between an electrical component 32 and an electrolytic condenser 34. A circuit board 30 also defines an air hole 30a. These air holes 5a, 6a, and 30a are longitudinally arranged in line as shown in FIG. 7. Furthermore, each of both the electrolytic condenser 34 and the film condenser 32 is arranged on the circuit board 30 opposite the air hole 30a. Accordingly, halogen compounds, e.g., hexabromobenzene or lower molecular compounds, e.g., bromide compounds created from hexabromobenzene, pass through the air holes 5a, 6a, and 30a and are released outside. When a fan (not shown) is further comprised, the above-mentioned hexabromobenzene or bromide compounds are efficiently released outside. In case of natural exhausting, the air holes may be constructed and arranged on the appropriate area of the housing considering the convection in the electrical apparatus.

Accordingly, hexabromobenzene or bromide compounds cannot penetrate the electrolytic condenser 34, so that the electrolytic condenser 34 hardly fails. An electrical apparatus 7, using the film condenser 32, therefore has a long life.

Figure 8:
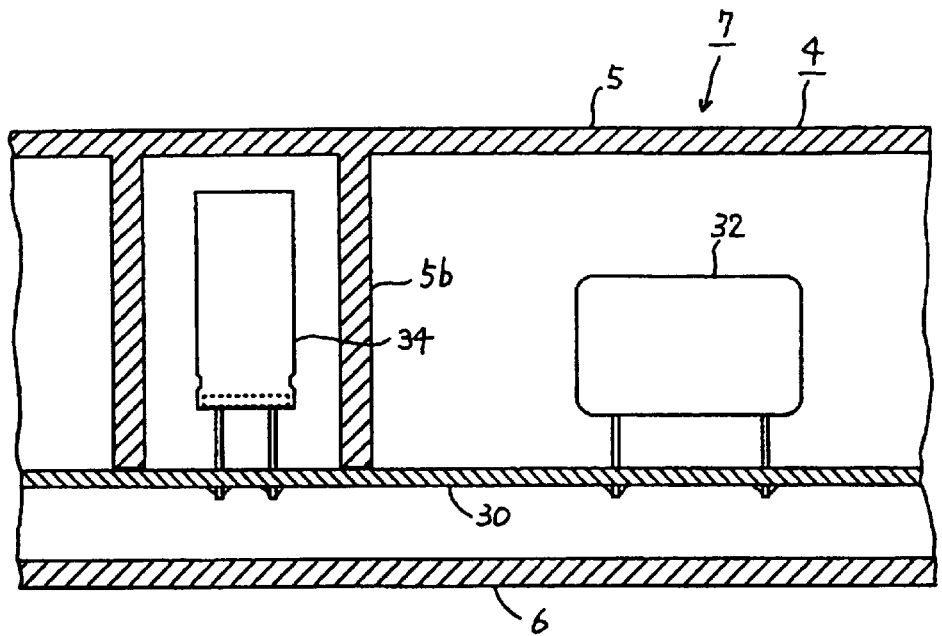
FIG. 8 is a partly enlarged longitudinal section of an electrical apparatus according to a fifth embodiment of the present invention.

FIG. 8 shows a partly enlarged longitudinal section of an electrical apparatus according to a fifth embodiment of the present invention. The same reference characters designate identical or corresponding elements to the elements of the electrical apparatus shown in FIG. 1. Therefore, a detailed explanation of such structures will not be provided.

In this embodiment, a cover 5 of a housing 4 further comprises a cylindrical shelter 5b, formed on the inner surface thereof uniformly or separately. The cylindrical shelter 5b may be provided on the circuit board 30. The cylindrical shelter 5b may only cover one end of the electrolytic condenser 34. Furthermore, the shelter is made of materials including synthetic resin such as silicone resin, urethane resin or poly vinyl chloride, metal such as aluminum, glass, or ceramics, which prevent hexabromobenzene or bromide compounds from entering or diffusing therein.

When the cover 5 is united with a case 6, the cylindrical shelter 5b can protect the electrolytic condenser 34. One end of the cylindrical shelter contacts the surface of the circuit board 30. Accordingly, the cylindrical shelter 5b blocks off hexabromobenzene or bromide compounds. Therefore, hexabromobenzene or bromide compounds cannot penetrate the electrolytic condenser 34, so that the electrolytic condenser 34 is resistant to failure. As a result, an electrical apparatus 7, using the film condenser 32, has a long life.

Figure 9:
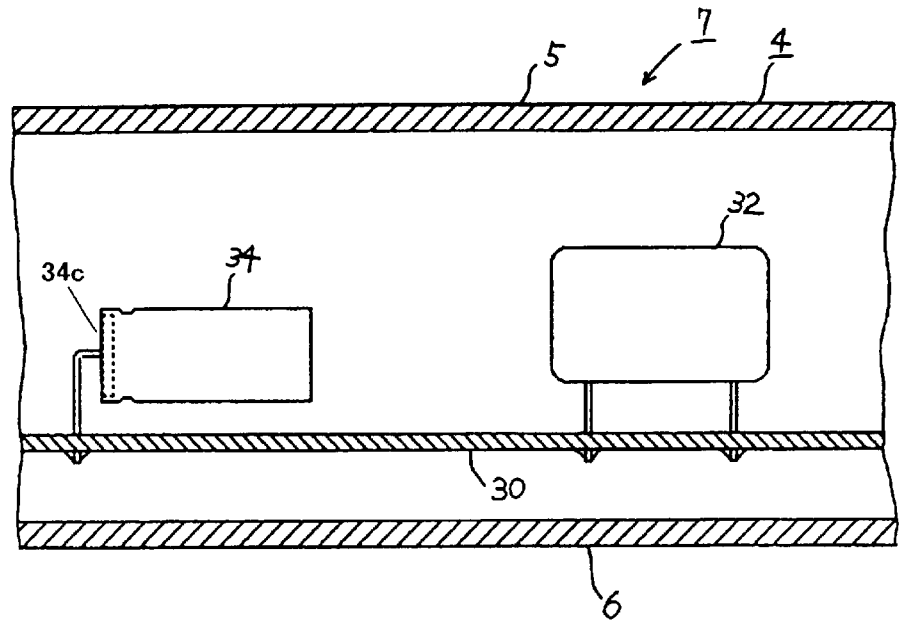
FIG. 9 is a partly enlarged longitudinal section of an electrical apparatus according to a sixth embodiment of the present invention.

FIG. 9 shows a partly enlarged longitudinal section of an electrical apparatus according to a sixth embodiment of the present invention. The same reference characters designate identical or corresponding elements to the elements of the electrical apparatus shown in FIG. 1. Therefore, a detailed explanation of such structures will not be provided.

In this embodiment, one end of an electrolytic condenser 34 is arranged with a packing rubber 34c facing away from a film condenser 32 on a circuit board 30. The one end of the electrolytic condenser 34 may preferably be 5 cm or more away from the film condenser 32. The distance between the one end of the electrolytic condenser 34 and the film condenser 32 may more preferably be 10 cm or more. Accordingly, it is difficult for hexabromobenzene ($C_6Br_6$) or bromide compounds to directly reach the one end of the electrolytic condenser 34 facing away from the film condenser 32. The above hexabromobenzene or bromide compounds, which are generated and remain in the housing, cannot easily penetrate the electrolytic condenser 34, so that the electrolytic condenser 34 is resistant to failure. An electrical apparatus 7 using the film condenser 32 has a long life.

Figure 10:
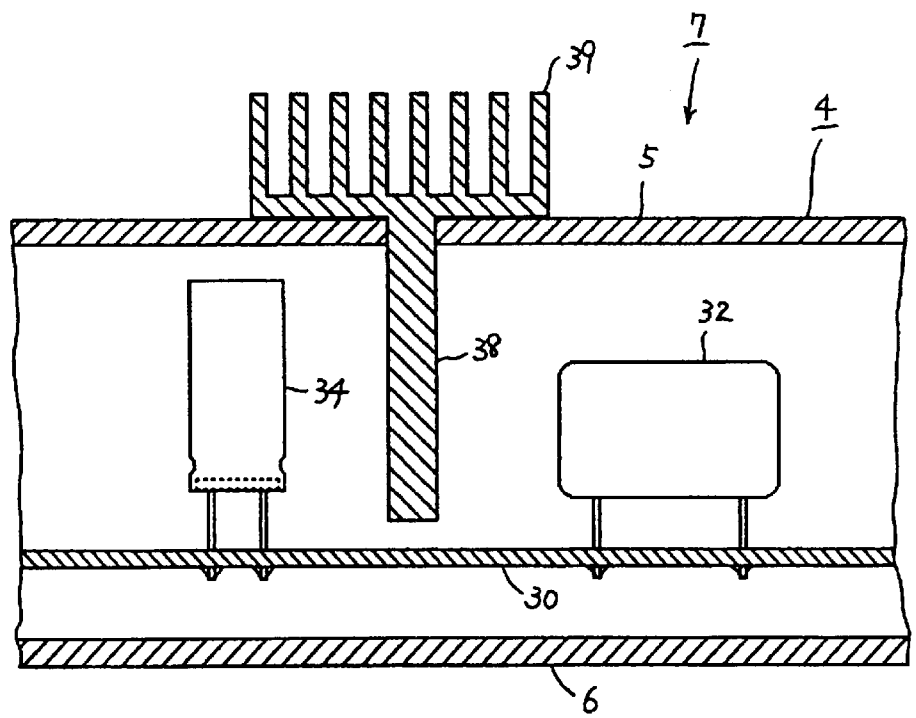
FIG. 10 is a partly enlarged longitudinal section of an electrical apparatus according to a seventh embodiment of the present invention.

FIG. 10 shows a partly enlarged longitudinal section of an electrical apparatus according to a seventh embodiment of the present invention. The same reference characters designate identical or corresponding elements to the elements of the electrical apparatus shown in FIG. 1. Therefore, a detailed explanation of such structures will not be provided.

In this embodiment, a heat sink 38, made of aluminum, is constructed and arranged between an electrolytic condenser 34 and a film condenser 32 in the an electrical apparatus 7. The heat sink 38 includes a radiator 39, located outside a housing 4. The generated hexabromobenzene or bromide compounds tend to move to the cold portion of the heat sink 38, and are captured by the heat sink 38. Furthermore, as the heat sink 38 can reduce the temperature inside the housing 4, hexabromobenzene or bromide compounds are not readily emitted from the film condenser 32 which comprises a molded body 32a made of epoxy resin including bromine (Br). The above hexabromobenzene or bromide compounds cannot readily penetrate the electrolytic condenser 34, so that the electrolytic condenser 34 is resistant to failure. An electrical apparatus 7, using the film condenser 32, accordingly has a long life.

An eighth embodiment of the invention will be described in detail with reference to FIGS. 1 to 4 of the first embodiment. Therefore, a detailed explanation of such structures will not be provided.

An electrical apparatus 7 such as a discharge lamp operating apparatus, shown in FIG. 1, is provided with a housing 4 accommodating a circuit board 30. The circuit board 30 mounts an electrolytic condenser 34 and electrical components. The electrolytic condenser 34 includes a body 34a filled with ethylene glycol type-electrolytic solution (not shown), electrodes (not shown) arranged in the body 34a, lead wires 34b extending from the body 34a, and a packing rubber 34c made of butyl rubber. The butyl rubber hardly passes halogen compounds through, so that the halogen compounds cannot readily penetrate the ethylene glycol type-electrolytic solution. Therefore, the electrodes of the electrolytic condenser are not readily corroded by the halogen ion.

The electrical components, such as a film condenser 32, include resin, which is flame retardant, containing polymer type-halogen compounds. The circuit board 30 further comprises an inverter circuit, including switching elements, e.g., a pair of transistors, for operating the discharge lamp.

In this embodiment, the electrical apparatus uses an electrolytic condenser filled with ethylene glycol type-electrolytic solution to get its long life. It is necessary for the electrical apparatus to operate during long term over about 10,000 hours. The polymer type-halogen compounds may include one or more selected from a group of bromine polycarbonate, bromine epoxy, and bromine styrene.

The above-mentioned polymer type halogen compounds themselves do not easily release outside the resin under ordinary conditions. However, the polymer type halogen compounds gradually decompose into lower molecular-halogen compounds, e.g., tribromophenol or dibromophenol, under high temperatures or humid circumstances. After the halogen compounds decompose, tribromophenol or dibromophenol tends to sublimate and release outside. Therefore, when the temperature is 120 degrees centigrade or less, the electrical apparatus can prevent the lower molecular-halogen compounds from generating outside the resin.

According to this embodiment, the halogen compounds are hardly generated under ordinary conditions. Even if the halogen compounds are slightly emitted outside, the electrolytic condenser is packed by the butyl rubber, so that the butyl rubber effectively blocks off the halogen compounds. Therefore, the electrolytic condenser or the electrical apparatus has a long life.

A ninth embodiment of the invention will be described in detail with reference to FIGS. 1 to 4 of the first embodiment. Therefore, a detailed explanation of such structures will not be provided. In this embodiment, electrical components, such as a film condenser 32, use resin containing monomer type-halogen compounds (flame retardant) in place of the polymer type-halogen compounds, described in the eighth embodiment.

An electrical apparatus 7 such as a discharge lamp operating apparatus, shown in FIG. 1, is provided with a circuit board 30 mounting an electrolytic condenser 34 and electrical components. The monomer type-halogen compounds may include one or more selected from a group of hexabromobenzene, pentabromobenzene, tetrabromochlorobenzene, and tribromobisphenol.

The above-mentioned monomer type halogen compounds themselves tend to easily decompose at low temperature, and release outside the resin. However, even if the halogen compounds are emitted outside the resin, the electrolytic condenser is packed by the butyl rubber, so that the butyl rubber effectively blocks off the halogen compounds. Therefore, the electrolytic condenser of the electrical apparatus has a long life.

In cases that the packing rubber is made by mixing a butyl rubber and etylenpropyleneterephthalate rubber, the electrical components may be used at environmental temperatures of about 50 degrees centigrade or less during the electrical apparatus operation. The temperature can be reduced due to defining air holes to the housing. Therefore, the halogen compound is not easily generated. Even though the above mentioned mixed rubber can more readily pass the halogen compounds through (as compared with the butyl rubber), the little generated halogen compounds are not sufficient to cause corrosion because of the little amount generated. Therefore, the electrolytic condenser of the electrical apparatus has a long life.

Furthermore, the concentration of bromine (Br) ion in the electrolytic solution may be about 2 PPM or less during the electrical apparatus operation. When the halogen compound is chlorine (Cl), the concentration of chlorine ion in the electrolytic solution may be about 10 PPM or less, so as not to corrode the electrodes.

Furthermore, the electrolytic condenser is supplied with a voltage of about 200 V or less. As the voltage affects the speed of halogen ionizing, the low voltage can control the corroding speed of electrodes made of aluminum. Therefore, the electrolytic condenser or the electrical apparatus can have a long life.

The above mentioned embodiments of the invention are described about cases of only the film condenser containing halogen compounds, e.g., hexabromobenzene ($C_6Br_6$). However, other electrical components containing halogen compounds (flame retardant) may be used in the housing.

What is claimed is:

1. An electrical apparatus comprising:
   a circuit board, providing an electrolytic condenser and electrical components;
   the electrolytic condenser, including a body filled with ethylene glycol type-electrolytic solution, electrodes arranged in the body, lead wires extending from the body, and a packing rubber made of butyl rubber;
   the electrical components, including resin containing one or more polymer type-halogen compounds; and
   a housing, accommodating the circuit board.

2. An electrical apparatus according to claim 1, wherein the one or more polymer type-halogen compounds include one or more selected from a group of bromine polycarbonate, bromine epoxy, and bromine styrene.

3. An electrical apparatus according to claim 1, wherein one of the electrical components is a film condenser.

4. An electrical apparatus according to claim 1, wherein the electrical components are used at temperatures within the range of about 70 to about 120 degrees centigrade during the electrical apparatus operation.

5. An electrical apparatus according to claim 1, wherein the circuit board includes an inverter circuit for operating a discharge lamp.

6. An electrical apparatus comprising:
   a circuit board, providing an electrolytic condenser and electrical components;
   the electrolytic condenser, including a body filled with ethylene glycol type-electrolytic solution, electrodes arranged in the body, lead wires extending from the body, and a packing rubber made of butyl rubber;
   the electrical components using resin, containing one or more monomer type-halogen compounds; and
   a housing, accommodating the circuit board.

7. An electrical apparatus according to claim 6, wherein the one or more monomer type-halogen compounds include one or more selected from a group of hexabromobenzene, pentabromobenzene, and tetrabromochlorobenzene.

8. An electrical apparatus according to claim 7, wherein the concentration of bromine (Br) ion in the electrolytic solution is about 2 PPM or less during the electrical apparatus operation.

9. An electrical apparatus according to claim 6, wherein the packing rubber is made of a mixture of butyl rubber and etylenpropyleneterephthalate rubber;
   the housing defines air holes; and
   the electrical component are used at temperatures of about 50 degrees centigrade or less during the electrical apparatus operation.

10. An electrical apparatus according to claim 6, wherein the electrolytic condenser is supplied with a voltage of about 200 V or less.

* * * * *